United States Patent
Kazi et al.

(10) Patent No.: US 11,452,244 B2
(45) Date of Patent: Sep. 20, 2022

(54) REVERSE FLOW PREVENTION

(71) Applicant: Microsoft Technology Licensing, LLC, Redmond, WA (US)

(72) Inventors: Rameez Kazi, Bellevue, WA (US); Neeraj Ladkani, Bothell, WA (US); Brandon Earl Gary, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 212 days.

(21) Appl. No.: 16/730,836

(22) Filed: Dec. 30, 2019

(65) Prior Publication Data

US 2021/0204452 A1 Jul. 1, 2021

(51) Int. Cl.
*H05K 7/00* (2006.01)
*H05K 7/20* (2006.01)
*G05B 13/02* (2006.01)

(52) U.S. Cl.
CPC ....... *H05K 7/20836* (2013.01); *G05B 13/024* (2013.01); *G05B 13/0265* (2013.01); *H05K 7/20736* (2013.01)

(58) Field of Classification Search
CPC .......... H05K 7/20836; H05K 7/20736; G05B 13/024; G05B 13/0265
See application file for complete search history.

(56) References Cited

U.S. PATENT DOCUMENTS

| | | |
|---|---|---|
| 7,233,877 B2 | 6/2007 | King et al. |
| 7,894,191 B2 | 2/2011 | Tsuchiya |
| 9,207,732 B1 | 12/2015 | Chen et al. |
| 9,918,410 B2 | 3/2018 | Humphrey et al. |
| 10,018,202 B1* | 7/2018 | Lai ................ F04D 29/661 |
| 10,405,462 B2 | 9/2019 | Chen et al. |
| 2008/0151490 A1* | 6/2008 | Fan ................... G06F 1/20 361/679.47 |
| 2009/0056359 A1* | 3/2009 | Germagian ........ H05K 7/20836 62/259.2 |
| 2010/0033922 A1* | 2/2010 | Zwinger ............ H05K 7/20209 361/679.48 |
| 2013/0045114 A1* | 2/2013 | Chang ................ F04D 25/166 417/45 |
| 2013/0063888 A1* | 3/2013 | Wang ................ H05K 7/20736 361/679.48 |
| 2014/0098493 A1* | 4/2014 | Chen ................ H05K 7/20145 361/692 |

(Continued)

FOREIGN PATENT DOCUMENTS

EP 2846114 A2 3/2015

OTHER PUBLICATIONS

"International Search Report and Written Opinion Issued in PCT Application No. PCT/US20/060819", dated Feb. 23, 2021, 12 Pages.

*Primary Examiner* — Paul B Yanchus, III
(74) *Attorney, Agent, or Firm* — Rainier Patents, P.S.

(57) ABSTRACT

The present concepts maintain forward flow and prevent reverse flow of heat-transferring media. A first zone and a second zone are proximate to each other. A first fan moves air through the first zone in a forward direction. A second fan moves air through the second zone in a forward direction. The speed of the first fan is compared with the speed of the second fan. If the first fan speed is slower than the second fan speed, then the first fan speed is adjusted to match the second fan speed. Therefore, reverse airflow in the first zone is prevented.

20 Claims, 6 Drawing Sheets

(56) References Cited

U.S. PATENT DOCUMENTS

| | | | |
|---|---|---|---|
| 2016/0265544 A1* | 9/2016 | Chen | F04D 29/584 |
| 2017/0102747 A1* | 4/2017 | Ragupathi | H05K 7/20736 |
| 2018/0017064 A1 | 1/2018 | Pollock et al. | |
| 2019/0235597 A1 | 8/2019 | Chen et al. | |

* cited by examiner

REVERSE FLOW PREVENTION

BACKGROUND

The present concepts relate to heat regulation and flow control. In particular, the present concepts can prevent undesirable reverse flow of medium that can hinder proper cooling of heat-generating elements.

BRIEF DESCRIPTION OF THE DRAWINGS

The accompanying drawings illustrate implementations of the present concepts. Features of the illustrated implementations can be more readily understood by reference to the following descriptions in conjunction with the accompanying drawings. Like reference numbers in the various drawings are used where feasible to indicate like elements. The accompanying drawings are not necessarily drawn to scale. In the figures, the left-most digit of a reference number identifies the figure in which the reference number first appears. The use of similar reference numbers in different instances in the description and the figures may indicate similar or identical items.

DETAILED DESCRIPTION

The present concepts relate to preventing reverse flow of medium in a temperature-regulated environment. The medium used for regulating temperature may include air, water, or any other medium that can transfer heat. For example, in a scenario of using air to cool an environment that contains one or more heat-generating elements, cool air may be drawn into the environment, the cool air in the environment may turn into warm air due to the heat-generating elements, and the warm air may be pushed out of the environment. In such an implementation, any reverse airflow (i.e., the flow of air in the opposite direction such as drawing warm air into the environment and/or pushing cool air out of the environment) would be undesirable as it would hinder or impede the desired temperature regulation.

Several example implementations of the present concepts will be described below in connection with controlling airflow in data center environments to cool heat-generating electronic devices. However, the present concepts are applicable in a wide range of other contexts, such as controlling the flow of water to regulate temperature and using warm medium to heat elements rather than using cold medium to cool elements. Furthermore, the present concepts are also applicable in a variety of environments that can benefit from temperature regulation using flow of heat-transferring medium. Examples of some problems that can be addressed by the present concepts will be described below starting from a macro-level environment and proceeding to a more micro-level environment. And then, example solutions for addressing those problems will be described.

Figure 1:
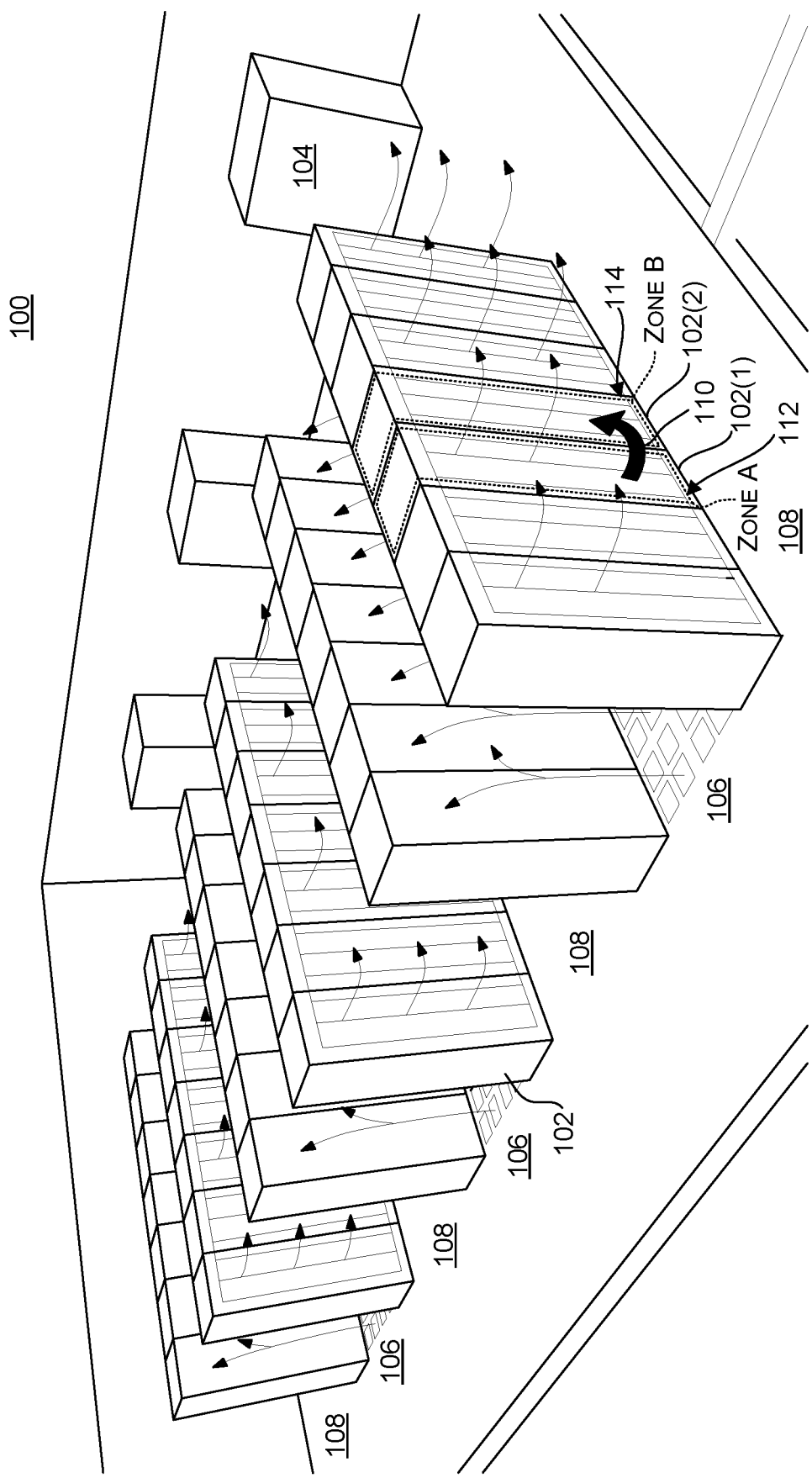
FIG. 1 illustrates an example data center, consistent with the present concepts.

FIG. 1 illustrates a data center 100, consistent with the present concepts. The data center 100 may be an environment that includes one or more heat-generating elements, such as electronic devices, persons, lighting fixtures, and heat emanating from the surrounding (e.g., neighboring rooms, adjacent floors). For example, the data center 100 may include server computing devices, network devices, and power distribution units (PDUs). These electronic devices may be stored in cabinets 102 that are arranged in one or more rows as shown in FIG. 1.

The data center 100 may be temperature-regulated using a heating, ventilation, and air-conditioning (HVAC) system. The HVAC system can include one or more centralized HVAC systems and/or one or more stand-alone HVAC systems 104. Moreover, the heat-generating elements inside the cabinets 102 may be cooled by passing cool air through the cabinets 102. For instance, the HVAC system may produce cool air using air-conditioning techniques and push cool air into one or more cold aisles 106, and draw out warm air from the one or more hot aisles 108. The terms cold and hot are used interchangeably with the terms cool and warm, respectively. Also, these terms are used merely to indicate relative temperatures not absolute temperatures, and thus "cool" air may not necessarily feel cool to human touch.

The cabinets 102 may contain one or more fans to direct the airflow from the cold aisle 106 to the hot aisle 108. (Example fans are discussed below relative to FIGS. 2-4). The fans may operate based on one or more parameters, such as fan speed, air speed, power level, fan direction, etc. Accordingly, the cabinets 102 may function as conduits (e.g., a channel, duct, tube, pipe, or plenum) that allow cool air from the cold aisles 106 to flow into the cabinets 102 to cool the heat-generating elements in the cabinets 102, and to allow warm air to flow out of the cabinets 102 to the hot aisles 108.

In one example implementation, the HVAC system may attempt to maintain a maximum temperature of, for example, 35 degrees Celsius in the cold aisles 106. Depending on the temperature differential caused by the heat-generating electronic devices in the cabinets 102, the temperature in the hot aisles 108 may be higher, for example 75 degrees Celsius. Other temperature settings may be used with the present concepts, depending on the desired cooling preferences of specific contexts as well as the amount of heat generated by the heat-generating elements that can benefit from cooling.

Effectively cooling the heat-generating elements in the cabinets 102 may involve maintaining forward airflow, i.e., cool air from the cold aisle 106 into the cabinets 102 and warm air out from the cabinets 102 to the hot aisle 108. However, a potential problem may exist where reverse airflow (indicated by arrow 110) occurs, for example, warm air flowing into the cabinets 102 from the hot aisle 108. Reverse airflow can cause the electronic devices inside the cabinets 102 to function inefficiently, malfunction, and/or overheat. Reverse airflow can also shorten the lifespan of the electronic devices.

Reverse airflow can occur, for example, if warm air pushed out from one cabinet 102(1) into the hot aisle 108 flows into another cabinet 102(2). Suppose each cabinet 102 in the data center 100 defines a zone, such that the data center 100 includes a plurality of zones, including a first zone 112 and a second zone 114. In one example, the first zone 112 may be Zone A defined by the cabinet 102(1), and the second zone 114 may be Zone B defined by the cabinet 102(2). Then, each zone would draw cool air from the cold aisle 106 and push warm air out to the hot aisle 108. However, if Zone A is pushing warm air out to the hot aisle 108 at a first speed, which is high, and Zone B is pushing warm air out to the hot aisle 108 at a second speed, which is low (or not pushing air out at all), then warm air from the hot aisle 108 may flow into Zone B. Such reverse airflow would impede cooling the heat-generating elements inside Zone B. Reverse airflow can sometimes occur where the air pressure at Zone B is lower than the air pressure at Zone A, and/or the airflow rate (often measured in cubic feet per minute) at Zone B is lower than the airflow rate at Zone A. These problematic scenarios can occur if the fans in Zone B are operating at slower speeds than the fans in Zone A. Solutions to these reverse airflow problems provided by the present concepts will be described below after additional example problems are demonstrated.

Figure 2:
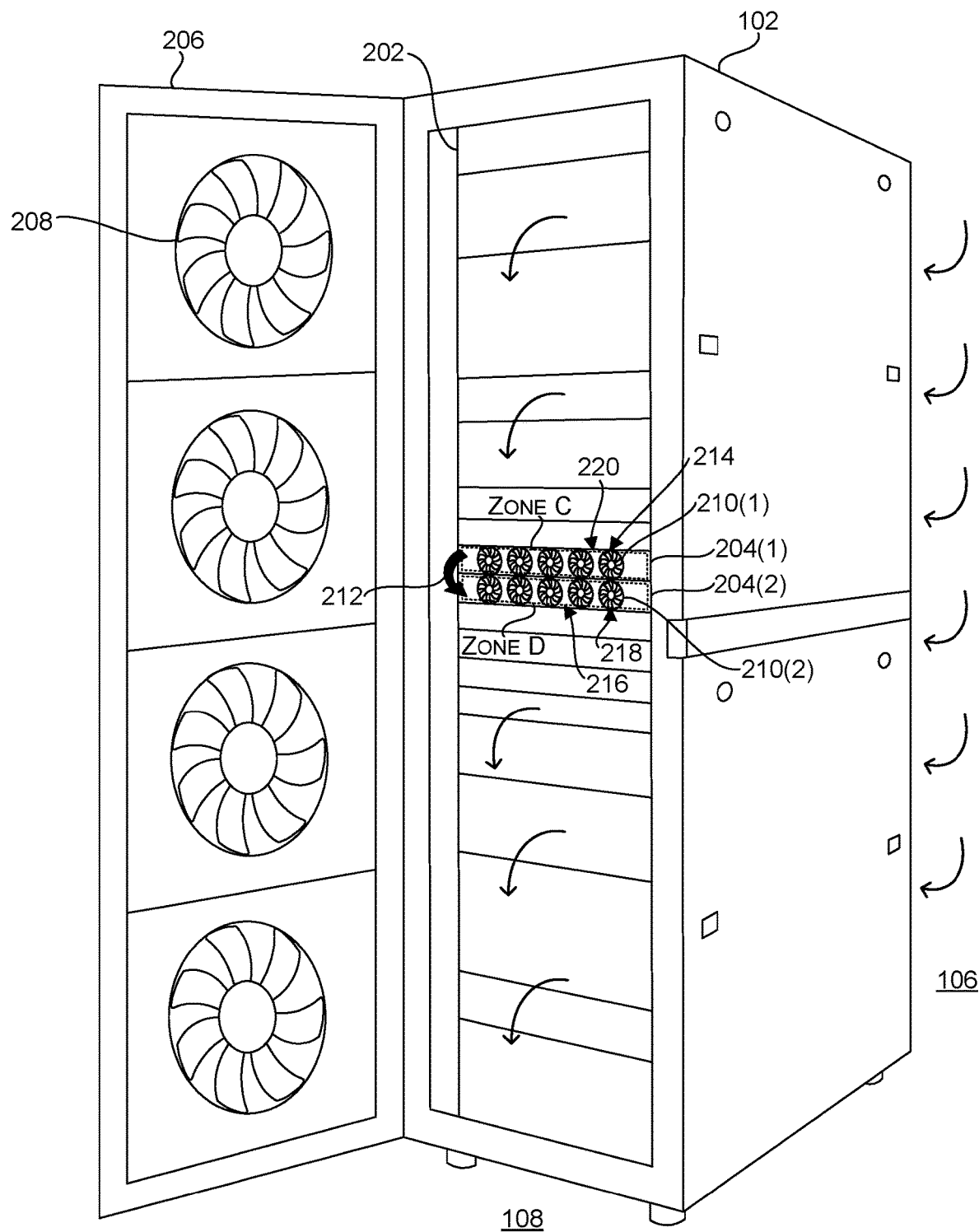
FIG. 2 illustrates an example server rack cabinet, consistent with the present concepts.

FIG. 2 illustrates an example cabinet 102, consistent with the present concepts. The cabinet 102 illustrated in FIG. 2 may be one of the cabinets 102 (also called enclosures) illustrated in FIG. 1 as being arranged in rows. The cabinet 102 may include one or more racks 202 on which one or more electronic devices 204 may be mounted. Examples of the electronic devices 204 may include computing devices (e.g., servers), network devices (e.g., routers and switches), storage devices (e.g., storage area networks (SANs), network-attached storage (NAS), and tape drive storage), power units (e.g., uninterruptible power supply (UPS)), etc.

The electronic device 204 may generate heat and may benefit from cooling for efficient operations and prolonged lifespan. In the example implementation illustrated in FIG. 2, the electronic devices 204 may be mounted on the rack 202 inside the cabinet 102 in such a way that the front of the electronic devices 204 faces the cold aisle 106 and the back of the electronic devices 204 faces the hot aisle 108.

As described above with respect to FIG. 1, the cabinet 102 may act like a conduit that directs the airflow from the cold aisle 106 to the hot aisle 108. To facilitate the airflow through the cabinet 102, a front door and a back door 206 of the cabinet 102 may be porous (e.g., a mesh, a grill, or a vent) to allow easy flow of air. To implement and/or assist this forward airflow from the cold aisle 106 to the hot aisle 108 through the cabinet 102, one or more cabinet fans 208 may optionally be installed. The cabinet fans 208 may be installed at the back of the cabinet 102 (e.g., on the back door 206 as illustrated in FIG. 2), the front of the cabinet 102, and/or anywhere in the middle of the cabinet 102. The cabinet fans 208 may be configured to move air in the forward direction from the cold aisle 106 to the hot aisle 108. The cabinet fans 208 may be controlled by a cabinet fan controller.

A controller may be any type of device that has processing capabilities and/or storage capabilities, and performs the functions of the instructions it stores. Storage capabilities may be provided by any computer-readable storage media. As used herein, the term "computer-readable media" can include transitory propagating signals. In contrast, the term "computer-readable storage media" excludes transitory propagating signals. Computer-readable storage media may include computer-readable storage devices. Examples of computer-readable storage devices may include volatile storage media, such as random-access memory (RAM), and non-volatile storage media, such as hard drives, optical discs, and flash memory, among others. Computer-readable storage media can include any one or more of volatile or non-volatile memory, hard drives, flash storage devices, optical storage devices (e.g., CDs, DVDs), and/or remote storage (e.g., cloud-based storage), among others. Computer-readable store media may store data, such as computer-readable instructions and/or user-related data. The computer-readable instructions may by executed by processing capabilities to perform certain functions. Processing capabilities can be provided by one or more hardware processors that can execute data in the form of computer-readable instructions to provide a functionality. Processing capabilities can be provided by central processing units (CPUs), microcontrollers, processor cores, or other types of processing devices. Thus, any of the controllers discussed herein could be implemented on the CPU, for example, and/or could be implemented on dedicated processing units, in another example.

Furthermore, the electronic devices 204 may contain one or more heat-generating elements that can benefit from cooling for proper operations. The heat-generating elements inside the electronic devices 204 may be cooled by passing cool air through the electronic devices 204. To implement and/or assist forward airflow from the cold aisle 106 to the hot aisle 108 through the electronic devices 204, one or more system fans 210 may be installed. The system fans 210 may be configured to direct airflow from the cold aisle 106 to the hot aisle 108. The system fans 210 may be installed at the back of the electronic devices 204 (as illustrated in FIG. 2), the front of the electronic devices 204, and/or anywhere in the middle of the electronic devices 204. The system fans 210 may be controlled by a system fan controller. Accordingly, the electronic devices 204 may function as conduits for airflow from the cold aisle 106 to the hot aisle 108.

Therefore, effectively cooling the heat-generating elements in the electronic devices 204 may involve maintaining forward airflow, i.e., cool air from the cold aisle 106 into the electronic devices 204 and warm air out from the electronic devices 204 to the hot aisle 108. However, a potential problem may exist where reverse airflow (indicated by arrow 212) occurs, for example, warm air flowing into the electronic devices 204 from the hot aisle 108. Reverse airflow can cause the heat-generating elements inside the electronic devices 204 to function inefficiently, malfunction, and/or overheat.

Reverse airflow can occur, for example, if warm air pushed out from one electronic device 204(1) into the hot aisle 108 flows into another electronic device 204(2). Suppose each electronic device 204 in the cabinet 102 defines a zone, such that the cabinet 102 includes a plurality of zones including a first zone 220 having a first fan 214 operating based on first parameters that cause the first fan 214 to rotate at a first speed, and a second zone 216 having a second fan 218 operating based on second parameters that cause the second fan 218 to rotate at a second speed. In one example, the first zone 220 may be Zone C defined by the electronic device 204(1), the first fan 214 may be the system fans 210(1), the second zone 216 may be Zone D defined by the electronic device 204(2), and the second fan may be the system fans 210(2). Then, each zone would draw cool air from the cold aisle 106 and push warm air out to the hot aisle 108. However, if Zone C pushes warm air out to the hot aisle 108 at a high speed and Zone D pushes warm air out to the hot aisle 108 at a lower speed (or not pushing air out at all), then warm air from the hot aisle 108 may flow into Zone D. Such reverse airflow would impede cooling the heat-generating elements inside Zone D. Reverse airflow can sometimes occur where the air pressure at Zone D is lower than the air pressure at Zone C, and/or the airflow rate at Zone D is lower than the airflow rate at Zone C. These problematic scenarios can occur if the system fans 210(2) in Zone D are operating at the second speed that is lower than the first speed at which the system fans 210(1) in Zone C operate. Solutions to these problems provided by the present concepts will be described below after additional example problems are demonstrated.

Figure 3:
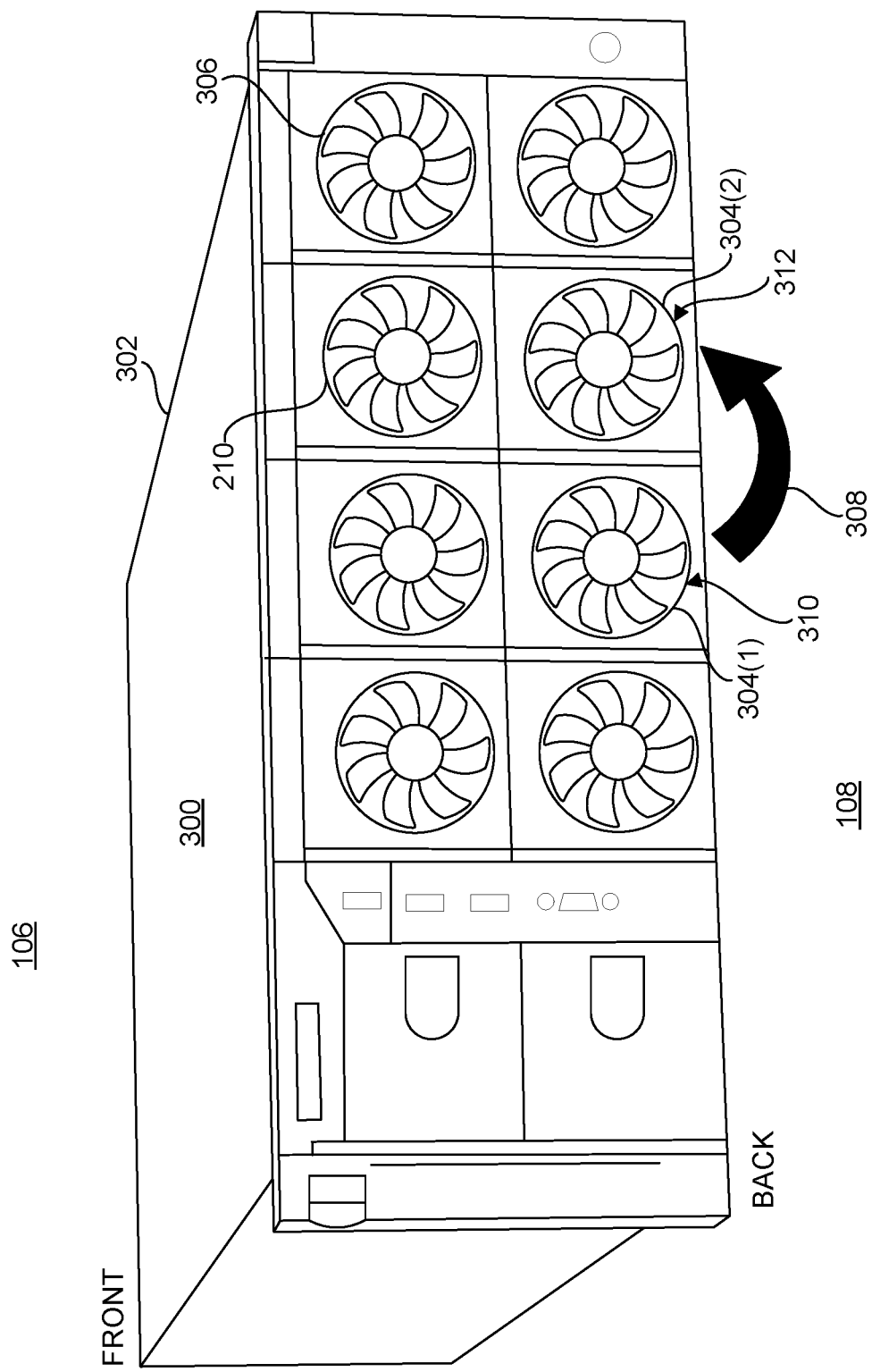
FIG. 3 illustrates the back of an example server, consistent with the present concepts.

FIG. 3 illustrates the back of an example server 300, consistent with the present concepts. The server 300 illustrated in FIG. 3 may be one of the electronic devices 204 illustrated in FIG. 2 that are mounted on the rack 202 inside the cabinet 102, such that the back of the server 300 may face the hot aisle 108 while the front of the server 300 may face the cold aisle 106.

The server 300 may include a system chassis 302 that houses one or more heat-generating elements that can benefit from cooling. In some implementations, the server 300 may include a plurality of fans, including a first fan 310 rotating at a first speed based on a first set of parameters, and a second fan 312 rotating at a second speed based on a second set of parameters. For example, the server 300 may have one or more server fans 304 positioned at the back of the server 300. The server fans 304 may include one or more system fans 210 for cooling the server 300, and the server fans 304 may also include one or more modular fans 306 for cooling one or more specific modules inside the server 300. The server fans 304 may be configured to direct forward airflow, i.e., to draw cool air from the cold aisle 106 in the front of the server 300 and to push warm air out the back of the server 300 to the hot aisle 108, thereby cooling the server 300 and/or various modules inside the server 300.

A potential problem may exist where reverse airflow (indicated by arrow 308 in FIG. 3) occurs, for example warm air flowing into the back of the server 300 from the hot aisle 108. Reverse airflow can cause the heat-generating elements inside the server 300 to function inefficiently, malfunction, and/or overheat. Reverse airflow can sometimes occur where the air pressure at one server fan 304(2) is lower than the air pressure at another server fan 304(1), and/or the airflow rate at one server fan 304(2) is lower than the airflow rate at another server fan 304(1). In one example, the first fan 310 may be the server fan 304(1), and the second fan 312 may be the server fan 304(2). Reverse airflow can occur, for example, if warm air pushed out into the hot aisle 108 from the back of the server 300 by the server fan 304(1) rotating at a first speed, which may be a high speed, recirculates into the back of the server 300 through the server fan 304(2) rotating at a second speed, which may be a low speed. Such reverse airflow would impede cooling the heat-generating elements inside the server 300. This problematic scenario can occur if the server fans 304 are operating at different speeds. As another example, where the first fan 310 is the system fan 210 and the second fan 312 is the modular fan 306, reverse airflow can occur if the modular fan 306 is rotating at lower speeds than the system fan 210. Solutions to these problems provided by the present concepts will be described below after additional examples problems are demonstrated.

Figure 4:
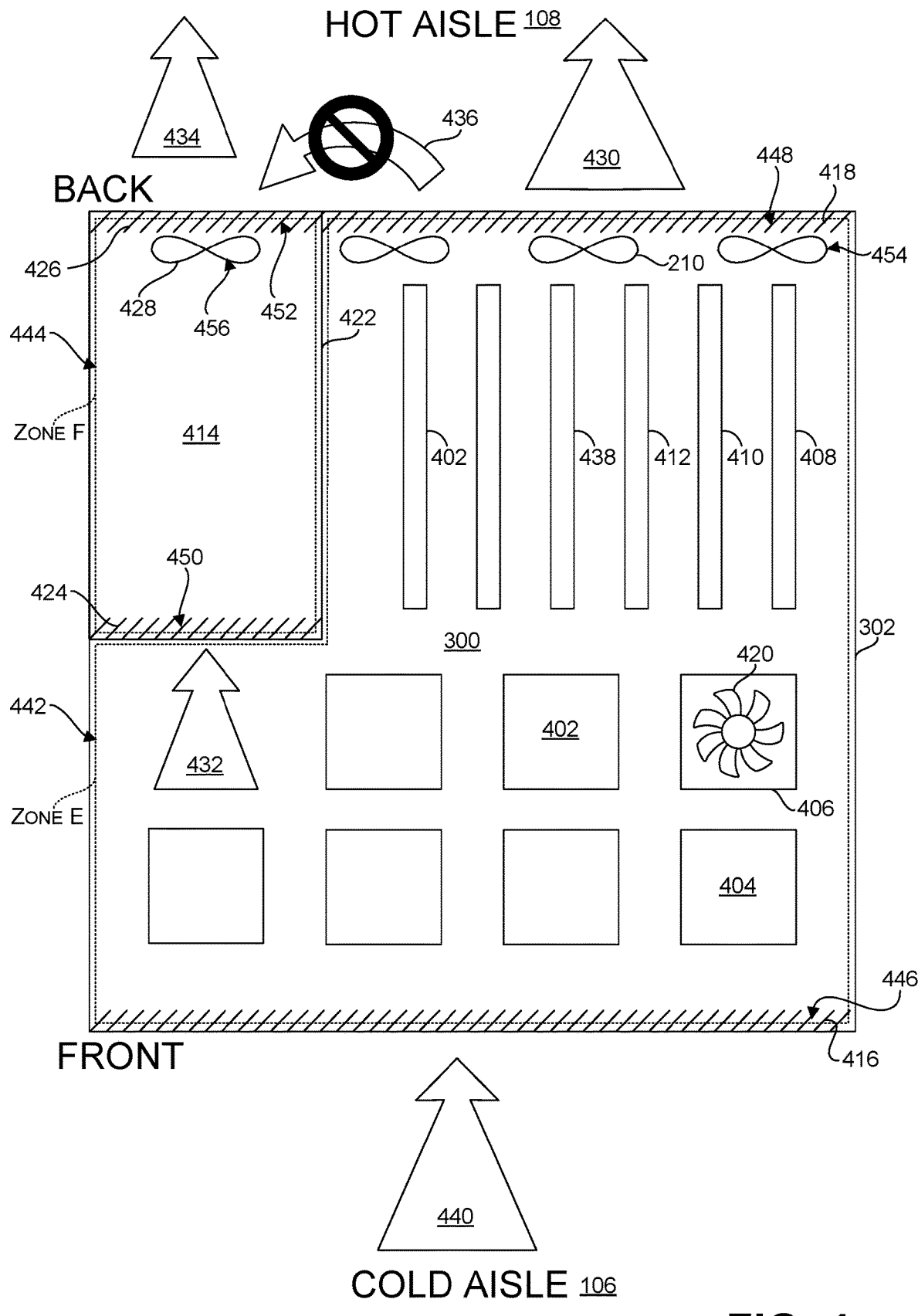
FIG. 4 illustrates the inside of an example server, consistent with the present concepts.

FIG. 4 illustrates the inside of the example server 300, consistent with the present concepts. The server 300 may include the system chassis 302 that houses one or more modules 402, such as a hard drive 404, a central processing unit (CPU) 406, a graphics card 408 having a graphics processing unit (GPU), a memory module 410, a network interface card (NIC) 412, a peripheral component interconnect (PCI) slot 438, a power supply unit (PSU) 414, etc. In the context of describing the server 300, the term "system" may refer to the server 300, and the term "module" may refer to a unit component or any element inside the server 300. In other contexts, the terms "system" may refer to a different object.

In some implementations, the server 300 may include a plurality of zones, including a first zone 442 and a second zone 444. The first zone 442 may include a first inlet 446 and a first outlet 448, and the second zone 444 may include a second inlet 450 and a second outlet 452. The server 300 may also include a plurality of fans, including a first fan 454 in the first zone 442 rotating at a first speed based on first parameters, and a second fan 456 in the second zone 444 rotating at a second speed based on second parameters.

The server 300 may operate more efficiently within a certain temperature range. Therefore, it may be undesirable for the server 300 to be too hot or too cold. The modules 402 inside the server 300 may generate heat and thus benefit from cooling to operate efficiently and to not interfere with operations of other modules 402. Accordingly, the server 300 may include one or more system fans 210. The purpose of the system fans 210 may be to regulate the temperature of the server 300 by cooling the server 300 in order to achieve efficient operation of the server 300 and to prolong the longevity of the server 300 and its modules 402. The server 300 may include a system fan controller for controlling the system fans 210.

In one implementation, the server 300 may be mounted on the rack 202 inside the cabinet 102 so that the front of the server 300 faces the cold aisle 106 and the back of the server 300 faces the hot aisle 108. The front of the server 300 may include a system inlet 416, and the back of the server 300 may include a system outlet 418. The system inlet 416 and the system outlet 418 may be any porous structure, such as vents, grills, or a mesh, that allows airflow. The system fans 210 may rotate to direct forward airflow from the front of the server 300 to the back of the server 300, thus drawing cool air from the cold aisle 106 through the system inlet 416 into the server 300 (as indicated by arrow 440) and pushing warm air from the server 300 through the system outlet 418 out to the hot aisle 108 (as indicated by arrow 430). Accordingly, the system chassis 302 can act like a conduit that channels cool air from the cold aisle 106 through the server 300 and pushes warm air out to the hot aisle 108.

The heat-generating modules 402 inside the server 300 may create a change in temperature of the cool air passing through the system inlet 416 and the warm air passing through the system outlet 418. For example, the cool air drawn from the cold aisle 106 into the server 300 through the system inlet 416 may be around 35 degrees Celsius. The cool air may cool the various heat-generating modules 402 inside the server 300, thus increasing the ambient temperature inside the server chassis 302. Consequently, the warm air pushed out from the server 300 to the hot aisle 108 through the system outlet 418 may be warmer than 35 degrees Celsius, for example around 75 degrees Celsius.

Furthermore, one or more of the modules 402 inside the server 300 may have their own dedicated modular fans 306. For example, the CPU 406 may have a CPU fan 420 for the purpose of cooling the CPU 406, and the graphics card 408 may include a GPU fan for cooling the GPU.

In one implementation, the PSU 414 may include a PSU chassis 422 having a PSU inlet 424 and a PSU outlet 426. The PSU 414 may further include a PSU fan 428 for the purpose of cooling the PSU 414. The PSU 414 may include a PSU fan controller for controlling the PSU fan 428.

The PSU inlet 424 and the PSU outlet 426 may be any porous structure, such as vents, grills, or a mesh, that allows airflow. The PSU fan 428 may rotate to direct airflow from the front of the PSU 414 to the back of the PSU 414, thus drawing cool air through the PSU inlet 424 into the PSU 414 (as indicated by arrow 432) and pushing warm air from the PSU 414 through the PSU outlet 426 out to the hot aisle 108 (as indicated by arrow 434).

Accordingly, the PSU chassis 422 can act as a conduit that channels cool air into the PSU 414 and pushes warm air out to the hot aisle 108. The cool air may help to maintain a proper operating temperature for the PSU 414 and prevent overheating the PSU 414. For example, the cool air drawn into the PSU through the PSU inlet 424 may be around 45 degrees Celsius. The temperature of the air at the PSU inlet 424 may be higher than the temperature of the air at the system inlet 416, because one or more heat-generating modules 402 inside the server 300 can cause a change in temperature of the air from the system inlet 416 to the PSU inlet 424. The cool air entering the PSU inlet 424 may cool internal components of the PSU 414, which increases the temperature of the air inside the PSU chassis 422. Consequently, the warm air pushed out from the PSU 414 to the hot aisle 108 through the PSU outlet 426 may be higher than 45 degrees Celsius, for example, around 60 degrees Celsius. The numerical temperatures provided herein are merely examples. Other temperature values are possible.

The system fans 210 and/or the PSU fan 428 may operate at a fixed speed. However, a fixed speed may be too slow to sufficiently cool the server 300 or the PSU 414 when it becomes too hot. On the other hand, a fixed speed may be too fast when the server 300 or the PSU 414 is cool and would not benefit from the excess airflow, thus wasting energy and unnecessarily shortening the longevity of the fans.

Alternatively, the system fans 210 and/or the PSU fan 428 may be operated at variable speeds. The speeds of the system fans 210 and/or the PSU fan 428 may be configured to vary depending on one or more parameters that correlate with the cooling needs of the server 300 and/or the PSU 414. For example, one or more temperature sensors (e.g., thermometers) may be located inside the server 300, and the system fan controller may be configured to vary the speed of the system fans 210 based on an algorithm that depends on the temperature readings from the thermometers. Similarly, the PSU fan controller may be configured to vary the speed of the PSU fan 428 based on temperatures readings from one or more thermometers that measure the ambient temperature of the PSU 414. Alternatively or additionally, one or more airflow sensors (e.g., anemometers) may be located in the server 300, and the system fan controller may vary the speed of the system fans 210 based on an algorithm that depends on the airflow direction and/or airflow speed readings from the anemometers. Similarly, the PSU fan controller may vary the speed of the PSU fan 428 based on readings from one or more anemometers that measure the speed and direction of airflow in the PSU 414.

Other parameters may be used for controlling the speeds of the system fans 210 and/or the PSU fan 428. For example, the system fan controller may be configured to set the speed of the system fans 210 according to an algorithm that depends on the utilization of the server 300 or the modules 402 (e.g., the hard drive 404, the CPU 406, the GPU, the memory module 410, the NIC 412, etc.) of the server 300. That is, when the server utilization is high, the system fan controller may rotate the system fans 210 at a high speed, whereas when the server utilization is low, the system fan controller may rotate the system fans 210 at a low speed. The server utilization may be an indirect measurement of the server temperature, because the server 300 and the modules 402 therein typically generate more heat with higher utilization. Similarly, the PSU fan controller may be configured to set the speed of the PSU fan 428 according to the utilization level of the PSU 414, which may correlate with the power utilization of the server 300, which may be the sum of power consumptions by the modules 402 inside the server 300. That is, when the power utilization is high, the PSU fan controller may rotate the PSU fan 428 at a high speed, whereas when the power utilization is low, the PSU fan controller may rotate the PSU fan 428 at a low speed. The terms "high" and "low" with respect to fan speeds are merely relative terms and are not meant to signify any absolute speeds or any particular speed settings (e.g., where a fan has only three speed settings: off, low, and high).

In one implementation, the system fan controller and/or the PSU fan controller may control the system fans 210 and/or PSU fan 428, respectively, using a pulse-width modulation (PWM) signal. A PWM signal may be used to turn on, turn off, and/or vary the speed of the system fans 210 and/or the PSU fan 428.

Effectively cooling the heat-generating elements in the server 300 may involve the system fans 210 maintaining forward airflow, i.e., cool air in from the cold aisle 106 to the server 300 and warm air out from the server 300 to the hot aisle 108. Similarly, effectively cooling the internal components of the PSU 414 may involve the PSU fan 428 maintaining forward airflow, i.e., cool air in through the PSU inlet 424 to the PSU 414 and warm air out from the PSU 414 through the PSU outlet 426 to the hot aisle 108. However, a potential problem may exist where reverse airflow (as indicated by arrow 436) occurs, i.e., warm air flowing into the PSU 414 from the hot aisle 108 through the PSU outlet 426. Reverse airflow can cause the PSU 414 to function inefficiently, malfunction, and/or overheat.

In one example, the first zone 442 may be Zone E defined by the server chassis 302 minus the PSU chassis 422, the first inlet 446 may be the system inlet 416, the first outlet 448 may be the system outlet 418, the first fan 454 may be the system fans 210, the second zone may be Zone F defined by the PSU chassis 422, the second inlet 450 may be the PSU inlet 424, the second outlet 452 may be the PSU outlet 426, and the second fan 456 may be the PSU fan 428. Reverse airflow can occur, for example, if warm air pushed out by the system fans 210 through the system outlet 418 into the hot aisle 108 flows into the PSU 414 through the PSU outlet 426. Reverse airflow can sometimes occur where the air pressure at the PSU outlet 426 of Zone F is lower than the air pressure at the system outlet 418 of Zone E, and/or the airflow rate at the PSU outlet 426 of Zone F is lower than the airflow rate at the system outlet 418 of Zone E. If the system fans 210 in Zone E push warm air out to the hot aisle 108 at the first speed that is a high speed, and the PSU fan 428 in Zone F pushes warm air out to the hot aisle 108 at the second speed that is a lower speed (or not push air out at all), then warm air from the hot aisle 108 may flow into Zone F (i.e., the PSU 414) through the PSU outlet 426. Such reverse airflow would impede cooling the internal components of the PSU 414.

Such problematic scenarios can often occur where the system fans 210 located at the back of the server 300 are more powerful (e.g., in size, in number, in rotation speed, or a combination) than the PSU fan 428. When the system fans 210 rotate at higher speeds than the PSU fan 428, the warm air in the hot aisle 108 can be sucked into the PSU 414 through the PSU outlet 426, which is reverse airflow that can raise the ambient temperature in the PSU 414 and/or impede the cooling of the internal components of the PSU 414.

Reverse airflow can occur in various situations, including temperature differentials at various locations within the server 300. For example, if certain modules 402 in the server 300 that are positioned away from the PSU 414 (e.g., the CPU 406 and/or the GPU) were being over-utilized and generating significant amount of heat, then the ambient temperature near those modules 402 would rise, causing the system fans 210 to rotate at a high speed. However, due to the locations of these certain modules 402 being distant from the PSU 414, the temperature of the air at the PSU inlet 424 would not increase correspondingly, and thus the PSU fan 428 may operate at a low speed. As such, warm air blown out by the system fans 210 through the system outlet 418 into the hot aisle 108 would recirculate or backflow into the PSU 414 through the PSU outlet 426. Furthermore, there may be pressure differentials at various locations within the server 300. For example, if there is low pressure or negative pressure (i.e., pressure in the opposite direction towards the PSU inlet 424), then warm air from the hot aisle 108 may be pulled into the PSU 414 through the PSU outlet 426.

Running all fans (including the system fans 210 and the PSU fan 428) at the highest speed or even at the same speed at all times is not a good solution to the problem, because energy would be unnecessarily wasted. A conventional PSU fan controller typically only monitors temperatures within the PSU (either directly using temperature readings or indirectly based on power consumption and/or utilization levels) and increases the speed of a PSU fan speed if the temperature inside the PSU rises. This conventional method, which does not consider the speed of a system fan or temperatures inside the server but outside the PSU, often results in allowing reverse airflow. Thus, a conventional PSU fan controller and a conventional system fan controller, operating independently of each other, can cause problematic reverse airflow.

Accordingly, to address the above-described problems associated with reverse airflow, the PSU fan controller may be configured to control the speed of the PSU fan 428 based on feedback from the system fan controller. As such, rather than the PSU fan 428 and the system fans 210 fighting each other, they would instead work in tandem to move air forward within the PSU 414, prevent reverse airflow, and avoid any recirculation issues.

Consistent with the present concepts, a proposed solution may adjust the speed of the PSU fan 428 based on the speed of the system fan 210 (either directly based on the speed of the system fan 210 or indirectly based on temperature readings inside the server 300, airflow direction and speed readings inside the server 300, and/or utilization levels for the modules 402 in the server 300). This solution allows the PSU fan 428 to increase speed as the system fans 210 run faster to avoid reverse airflow into the PSU 414 from the hot aisle 108.

There are many ways to implement the present concepts. For example, in one implementation, the PSU fan controller may obtain the speed of the system fans 210 from the system fan controller. For instance, the PSU fan controller can periodically poll or monitor the speed of the system fans 210 from the system fan controller. Alternatively, the system fan controller may push the speed of the system fans 210 to the PSU fan controller. For instance, the system fan controller may be configured to transmit the speed of the system fans 210 to the PSU fan controller whenever the system fan speed changes. Then, the PSU fan controller may adjust the speed of the PSU fan 428 based on the obtained speed of the system fans 210. In another implementation, the system fan controller may set the speed of the PSU fan 428 based on the speed of the system fans 210, for example, by sending a request or a command to the PSU fan controller. In an alternative implementation, a master controller (separate from the system fan controller and the PSU fan controller) may communicate with both the system fan controller and the PSU fan controller to adjust the speed of the PSU fan 428 based on the speed of the system fans 210.

In one implementation, the PSU fan controller may compare the PSU fan speed with the system fan speed to determine whether a fan speed adjustment condition is met, and the PSU fan controller may be configured to adjust the speed of the PSU fan 428 in response to determining that the fan speed adjustment condition is met. The fan speed adjustment condition may be met if (1) the PSU fan speed is slower than the system fan speed, (2) the PSU fan speed is slower than the system fan speed by more than a certain threshold, or (3) the PSU fan speed is slower than a certain threshold speed above the system fan speed. The threshold may be zero or a higher value. The threshold may be a finite speed value or a percentage.

Furthermore, in response to comparing the PSU fan speed and the system fan speed and determining that a fan speed adjustment condition has been satisfied, the PSU fan controller may be configured to set a new speed for the PSU fan 428 that is (1) equal to the system fan speed, (2) a tolerance speed slower than the system fan speed, or (3) a tolerance speed faster than the system fan speed. The tolerance may be zero or a higher value. The tolerance may be a finite speed value or a percentage.

For example, the PSU fan controller may be configured to set the speed of the PSU fan 428 to be equal to the speed of the system fan 210 if the PSU fan controller detects that the difference between the system fan speed and the PSU fan speed divided by the system fan speed is more than ten percent. As another example, the PSU fan controller may be configured to set the speed of the PSU fan 428 to be faster than the speed of the system fan 210 by a certain tolerance (e.g., five percent higher than the system fan speed) if the PSU fan controller detects that PSU fan speed is slower than the system fan speed. These techniques can be implemented by the PSU fan controller, as described in the above examples, or by the system fan controller or the master fan controller, or a combination. Accordingly, when the system fan speed is increased, the PSU fan speed may increase correspondingly (either at par with, a tolerance speed faster, or a tolerance speed slower than the system fan speed) to avoid reverse airflow, even if the increased PSU fan speed exceeds the rate of airflow that is appropriate in view of the temperature of the PSU 414.

In some implementations, any of the PSU fan controller, the system fan controller, and/or the master fan controller may be configured to set a minimum speed for the PSU fan 428. Accordingly, the PSU fan 428 would rotate at either the speed that the PSU fan controller deems appropriate based on the PSU temperature or the minimum speed set based on the server fan speed, whichever is faster. That is, rather than directly controlling the actual speed of the PSU fan 428, a minimum speed for the PSU fan 428 may be enforced based on the system fan speed, such that if the PSU temperature justifies a PSU fan speed that is faster than the minimum speed, then the PSU controller can operate the PSU fan 428 at the higher PSU fan speed based on the PSU temperature, but if the PSU temperature calls for a PSU fan speed that is slower than the minimum speed, then the PSU controller can operate the PSU fan 428 at the higher minimum speed.

For example, the PSU 414 may have an override protection feature that prevents the system fan controller or the master fan controller from setting a slower speed for the PSU fan 428 than the speed at which the PSU fan controller wants to run the PSU fan 428. But, where the PSU fan controller wants to run the PSU fan 428 at a slow speed, the system fan controller or the master fan controller can set a minimum speed for the PSU fan 428 that is faster. So, even if the PSU 414 is cool and does not need the PSU fan 428 to run at a high speed, the PSU fan 428 may be controlled to run at a high speed and thus avoid reverse airflow.

As described above, the present concepts may keep airflow in the forward direction by adjusting fan speeds and thus achieve the goal of preventing negative pressure at the PSU outlet 426 that would cause reverse airflow. The present concepts may be implemented using various parameters relating to various measurements or readings as well as various units, such as revolutions per minute (RPM) for fan speeds, degrees Fahrenheit for temperature, cubic feet per minute for airflow, utilization percentages, etc.

Consistent with the present concepts, the PSU fan 428 may be agnostic of the particular server 300 that it is a part of. Therefore, the server 300 may be able to control the speed of the PSU fan 428 by having the system fan controller communicate with the PSU fan controller. For example, the system fan controller may be configured to be aware of the system fan speed as well as the PSU fan speed, so that the system fan controller can monitor both speeds and adjust the PSU fan speed appropriately as needed.

Furthermore, the present concepts implement feedback control. That is, the system fan speed is fed to the PSU fan controller that controls the PSU fan speed. The present concepts also allow for live monitoring of the fan speeds and real-time use of the monitored fan speeds to adjust the speed of the PSU fan 428 to prevent reverse airflow. The present concepts also incorporate power-saving techniques by increasing the PSU fan speed when necessary to prevent reverse airflow but still allow the PSU fan speed to decrease when the potential for reverse airflow does not exist.

Consistent with the present concepts, the PSU 414 may have inherent protection, so that the server 300 can only cause the PSU fan 428 to rotate at a higher fan speed than the speed at which the PSU fan controller wants to operate the PSU fan 428 but cannot cause the PSU fan 428 to rotate at a lower fan speed. This setup allows the PSU fan controller to operate the PSU fan 428 independently and override system commands if the PSU fan controller deems it necessary to run the PSU fan 428 at higher speeds to meet the PSU cooling needs.

Conventionally, if the temperature near the PSU inlet 424 increases, then the server 300 would respond by increasing the system fan speed to reduce pressure in front of the PSU inlet 424. However, the present concepts can instead utilize the full potential of PSU cooling mechanisms based on internal pressure changes in the PSU 414 that can be influenced by external pressure changes outside the PSU 414. As such, the PSU 414 and the server 300 may be interacting, but the PSU 414 need not necessarily rely on the server 300 to respond to the PSU 414 (or the PSU cooling needs).

The present concepts have been explained above in example scenarios in which the PSU fan 428 rotating significantly slower than the system fans 210 may cause reverse airflow of warm air into the PSU 414. However, the present concepts are also applicable to preventing reverse airflow of warm air into the server 300 where the system fans 210 rotate significantly slower than the PSU fan 428. In other words, the first zone 442 may be Zone F defined by the PSU chassis 422, the first inlet 446 may be the PSU inlet 424, the first outlet 448 may be the PSU outlet 426, the first fan 454 may be the PSU fan 428, the second zone may be Zone E defined by the server chassis 302 minus the PSU chassis 422, the second inlet 450 may be the system inlet 416, the second outlet 452 may be the system outlet 418, and the second fan 456 may be the system fans 210. Accordingly, adjusting the speed of the system fans 210 to match the speed of the PSU fan 428 can prevent reverse airflow of warm air from the hot aisle 108 into the server 300 through the system outlet 418.

Moreover, the present concepts explained above with respect to the server 300 and the PSU 414 may be applied to larger scales to prevent reverse airflow, for example, from server to server, from cabinet to cabinet, and to even more macro contexts. Referring back to FIG. 2, in a conventional setup, the electronic devices 204 in the rack 202 would typically operate their respective system fans 210 independently of each other. That is, the electronic device 204(1) would operate its system fans 210(1) based on the temperature of the electronic device 204(1), and separately, the electronic device 204(2) would operate its system fans 210(2) based on the temperature of the electronic device 204(2). Therefore, if the electronic device 204(1) is hotter than the electronic device 204(2) that is adjacent or close by and the system fans 210(1) are rotating faster than the system fans 210(2), then there may be reverse airflow (indicated by arrow 212) of warm air being drawn into the back of the electronic device 204(2) from the hot aisle 108.

The present concepts can help avoid reverse airflow in such a scenario by having the electronic device 204(1) and the electronic device 204(2) communicate with each other. For example, the electronic device 204(2) may be configured to adjust the speed of the system fans 210(2) based on the speed of the system fans 210(1) of the electronic device 204(1) in similar ways as described above with respect to the PSU 414 and the server 300. Such a technique may be implemented using a master controller that communicates with both the electronic device 204(1) and the electronic device 204(2). Accordingly, the system fans 210(2) can be prevented from rotating significantly slower than the system fans 210(1), and thereby maintaining forward airflow through electronic device 204(2).

At an even larger scale, the present concepts can prevent reverse airflow from cabinet to cabinet. Referring back to FIG. 1, there may be the possibility of reverse airflow (indicated arrow 110) where the cabinet 102(1) pushes warm air into the hot aisle 108 at a high speed and the cabinet 102(2) nearby pushes warm air into the hot aisle 108 at a low speed. Such reverse airflow may occur where fans (e.g., system fans 210 and/or cabinet fans 208) inside cabinet 102(2) are rotating at a slower speed compared to fans inside cabinet 102(1), because the fans in the cabinet 102(1) are operating independently of the fans in the cabinet 102(2).

The present concepts can help avoid reverse airflow in such a scenario by having fan controllers (e.g., cabinet fan controllers and/or system fan controllers) in the cabinet 102(1) and the cabinet 102(2) communicate with each other. For example, the fan controllers of the cabinet 102(2) may be configured to adjust the speed of the fans in the cabinet 102(2) based on the speed of the fans in the cabinet 102(1) in similar ways as described above with respect to the PSU 414 and the server 300. Such a technique may be implemented using a master controller that communicates with the fan controllers of both the cabinet 102(1) and the cabinet 102(2). Accordingly, the speed of forward airflow through cabinet 102(2) may be prevented from falling significantly lower than the speed of forward airflow through cabinet 102(1).

Although the presents concepts have been explained above in the context of a data center, the disclosed techniques for preventing reverse airflow may be applicable to and beneficial in a myriad of other contexts that involves temperature regulation. For example, maintaining forward airflow and preventing reverse airflow may be desirable in buildings with multiple floors and/or multiple rooms, food storages, vehicles including ships and airplanes, tunnels, factories, saunas, etc. Furthermore, the present concepts explained above are also applicable in maintaining forward flow and preventing reverse flow when using water as a heat-transferring medium to either cool or heat elements in an environment. For example, the present concepts may be beneficial to regulating temperatures of power plants, water tanks and pools, industrial factories, irrigation systems, and engines of vehicles such as cars, ships, and submarines, etc.

The number of elements (e.g., fans, servers, cabinets, etc.) illustrated in the figures and described herein are merely examples. For example, the number of system fans 210, the number of PSU fans 428, and the number of cabinet fans 208 can vary. The server 300 may include one PSU 414 with one PSU fan 428 or multiple PSU fans, or the server 300 may include multiple PSUs, each having one PSU fan. Furthermore, the position, size, orientation, model, and the type of fans illustrated and described are merely examples. The system fans 210, the PSU fan 428, and/or the cabinet fans 208 may be positioned at different locations, be of different sizes, be oriented differently, include a different number of blades, and/or be the same model or different models. Further, other cooling or heating mechanisms and/or other medium (e.g., various gases, such as air or various liquids, such as water) moving mechanisms besides fans may be used. The algorithms and formulas used by the above described fan controllers may be adjusted according to the fan size, fan count, fan blade count, etc. Moreover, although the present concepts have been described in the context of cooling the environment and preventing reverse airflow of warm air, the present concepts may be applied in the context of heating the environment and preventing reverse airflow of cool air.

In another example implementation of the present concepts, artificial intelligence may be utilized either as an alternative to or in conjunction with the rule-based algorithms described above for setting and adjusting the fan speeds. For example, the speed of the PSU fan 428 and/or the speed of the system fan 210 may be adjusted using machine-learning techniques. For instance, a training data set may be mined by gathering metrics (such as, temperature readings, pressure readings, airflow readings, module utilization levels, and/or power consumption levels) from one or more servers, which may include the server 300, that can provide ground truth data of actual reverse airflow (which can be detected using sensors). The training data set may be used to develop a machine-learning model using any artificial intelligence techniques, such as regression, classification, clustering, anomaly detection, dimensionality reduction, ensemble methods, simple neural networks, deep learning neural networks, decision trees, transfer learning, or reinforcement learning. The machine-learning model may then be used to predict and set the speed of (or set a minimum speed for) the PSU fan 428 and/or the system fan 210 that will prevent reverse airflow. That is, the machine-learning model may take the speed of the PSU fan 428 and the speed of the system fan 210 as inputs, perform a comparison, and output a new speed for one or both of the PSU fan 428 and the system fan 210 to prevent reverse airflow. The machine-learning model may iteratively perform the comparison based on updated speeds of the PSU fan 428 and the system fan 210, and adjust their speeds accordingly. The training data set may include data mined from the server 300 before the machine-learning model is deployed. Furthermore, further training data may be mined from the server 300 even after the machine-learning model has been deployed to adjust, fine-tune, and improve the machine-learning model on an ongoing basis.

Figure 5:
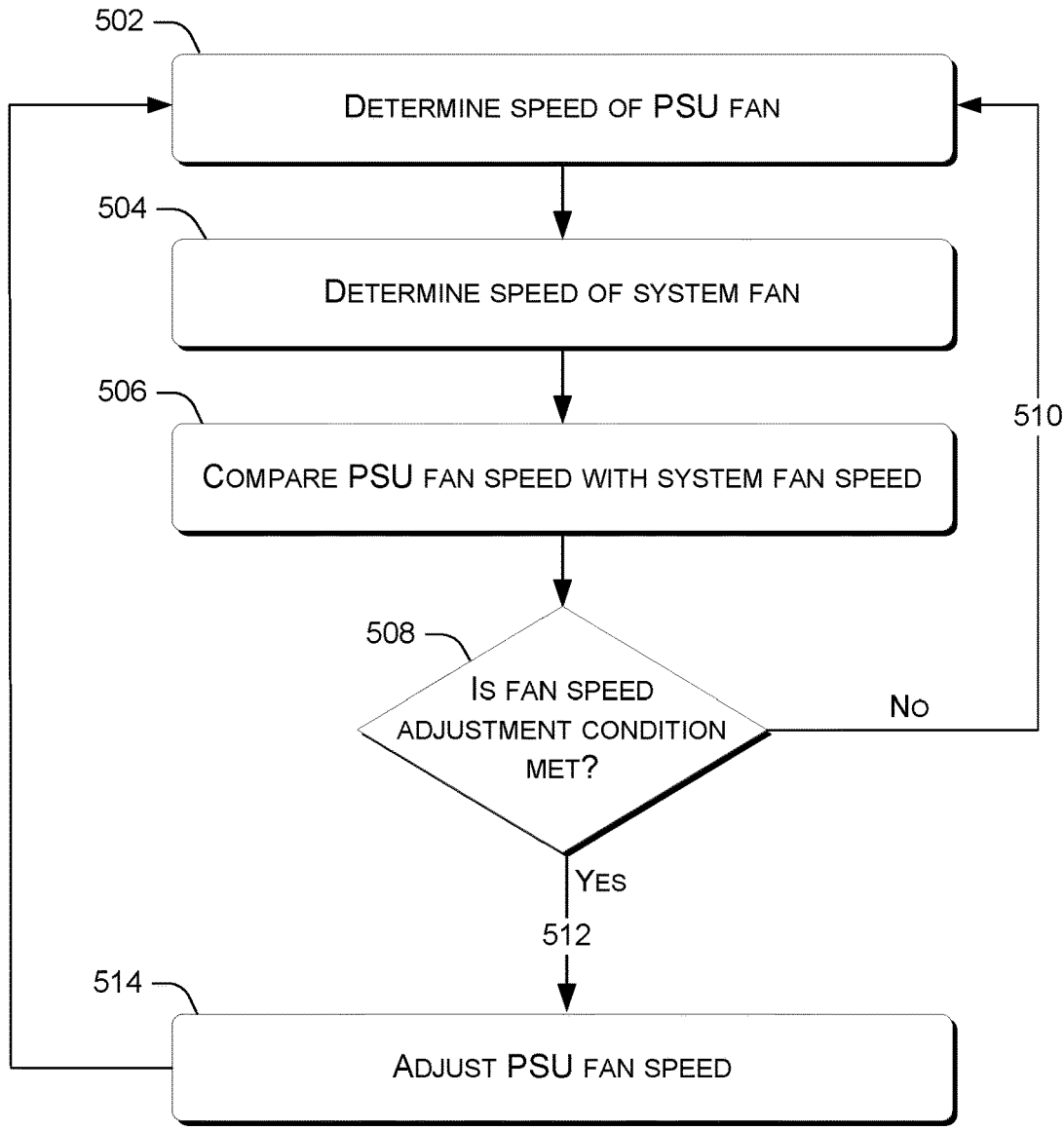
FIG. 5 shows a flowchart illustrating an example reverse airflow prevention method, consistent with the present concepts.

FIG. 5 shows a flowchart illustrating an example reverse airflow prevention method 500, consistent with the present concepts. The reverse airflow prevention method 500, in its entirety or in part, may be performed by the PSU fan controller, the system fan controller, and/or the master fan controller described above, or any other processor capable of executing instructions that can implement the techniques described herein.

In act 502, the speed of a PSU fan may be determined. For instance, the PSU fan speed may be read from a register that stores the value indicative of the PSU fan speed. Alternatively, the PSU fan speed may be requested from a PSU fan controller. Act 502 may be performed periodically, for example, every five seconds. Act 502 may be performed continuously (or appear to be performed continuously) by increasing the frequency, e.g., every 50 milliseconds. Alternatively or additionally, act 502 may be performed as needed or on demand, for example, when there is a change in state, such when a temperature reading changes or when a system fan speed changes.

In act 504, the speed of a system fan may be determined. Similar to act 502, act 504 may be performed by reading from a register that stores the value indicative of the system fan speed. Alternatively, the system fan speed may be requested from a system fan controller or a master fan controller. Act 504 may be performed periodically, for example, every second. Alternatively or additionally, act 504 may be performed as needed or on demand, for example, when there is a change in state, such when a temperature reading changes or when the system fan speed changes.

In act 506, the PSU fan speed may be compared with the system fan speed. The PSU fan speed and the system fan speed used to perform the comparison in act 506 may be obtained by act 502 and/or act 504. Alternatively, a controller performing act 506 may already know or have the PSU fan speed and/or the system fan speed. Act 506 of comparing the two speed values may include, for example, determining which of the two speed values is higher or lower, calculating a difference between the two speed values, determining the absolute value of the difference, and/or converting one or both of the two speed values into common units.

In act 508, the comparison in act 506 may be used to determine whether a fan speed adjustment condition is met. Thus, act 508 may be a decision point in the reverse airflow prevention method 500. Depending on various implementations of the present concepts, the fan speed adjustment condition may be met (1) if the PSU fan speed is slower than the system fan speed by any amount, (2) if the PSU fan speed is slower than the system fan speed by more than a certain threshold, or (3) if the PSU fan speed is slower than a certain threshold speed above the system fan speed. The threshold may be zero or a higher value. The threshold may be a finite speed value or a percentage. Where the threshold is a percentage, the difference between the PSU fan speed and the system fan speed may need to be divided by the system fan speed.

In one example implementation, the fan speed adjustment condition may be triggered if a formula (e.g., system fan speed minus PSU fan speed divided by system fan speed) is greater than 10%. If this condition is satisfied, then the PSU fan may be rotating at a significantly slower speed than the system fan and thus creating a potential for reverse airflow.

In decision 510 where the fan speed adjustment condition is not met, the method 500 may end or go back to act 502. If the fan speed adjustment condition is not met, then the PSU fan speed may be fast enough to avoid reverse airflow and thus no adjustment to the PSU fan speed may be necessary at this time.

In decision 512 where the fan speed adjustment condition is met, the method 500 may advance to act 514. If the fan speed adjustment condition is met, then the PSU fan speed may be too slow to prevent reverse airflow and thus adjusting the PSU fan speed may be necessary.

In act 514, the PSU fan speed may be adjusted based on the system fan speed. Depending on various implementations of the present concepts, an updated speed for the PSU fan may be set to be (1) equal to the system fan speed, (2) a tolerance speed slower than the system fan speed, or (3) a tolerance speed faster than the system fan speed. The tolerance may be zero or a higher value. The tolerance may be a finite speed value or a percentage. For example, where the threshold is 5%, the tolerance is 5%, and the system fan speed is currently 20,000 RPM, if the PSU fan speed falls below 19,000 RPM, then the PSU fan speed may be increased to 21,000 RPM. Accordingly, increasing the PSU fan speed to be equal to or close to the system fan speed helps to prevent reverse airflow.

In some implementations, the reverse airflow prevention method 500 may end after act 514 or may return to act 502 after act 514 to repeat the reverse airflow prevention method 500 in loops. The reverse airflow prevention method 500 may be repeated periodically or performed as needed in response to certain triggers.

Consistent with some implementations of the present concepts, additional acts and/or methods may be implemented to decrease the PSU fan speed. For example, if the system fan speed is lowered to a speed that is slower than the PSU fan speed (or slower than a certain threshold above or below the PSU fan speed), then the PSU fan speed may be decreased to be equal to the system fan speed (or to be a certain tolerance speed above or below the system fan speed). Thus, if the system fan speed decreases due to lowering temperatures in the server, then the PSU fan speed can correspondingly decrease in speed as well rather than running at unnecessarily high speeds and wasting power. Alternatively, as the system fan speed decreases, the minimum speed for the PSU fan may be correspondingly lowered, so that if the PSU cooling needs are also low, then the PSU fan speed may be decreased, but if the PSU cooling needs are still high, then the PSU fan may continue to run at a high speed despite a lower minimum speed setting.

Figure 6:
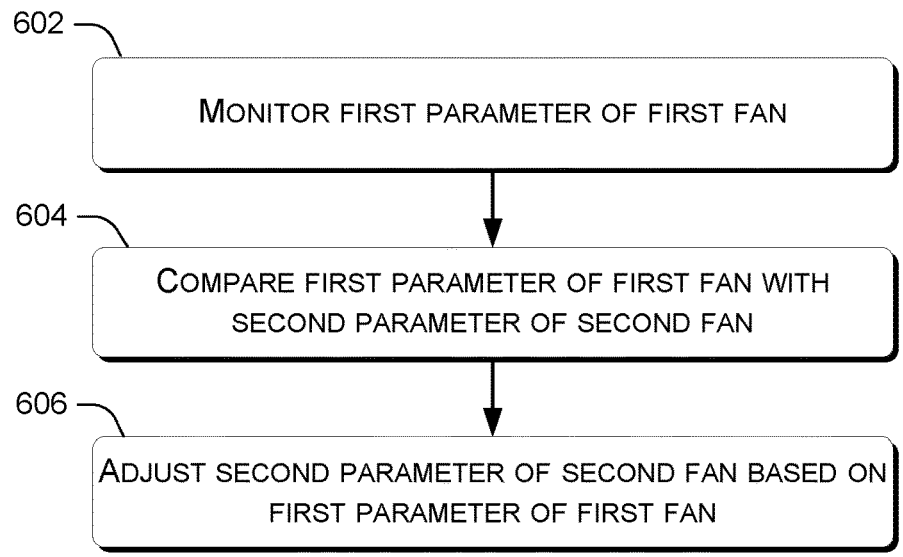
FIG. 6 shows a flowchart illustrating an example reverse flow prevention method, consistent with the present concepts.

FIG. 6 shows a flowchart illustrating another example reverse flow prevention method 600, consistent with the present concepts. The reverse flow prevention method 600 may be performed by a processor, a controller, a CPU, or a computing device that is capable of executing instructions that can implement the acts thereof.

In act 602, a first parameter of a first fan may be monitored. The first parameter may include fan speed, air speed, power level, fan direction, temperature reading, airflow direction and speed reading, resource utilization, and/or power consumption, among others. For example, a first speed of the first fan may be requested from a controller or read from storage. The monitoring may involve repeatedly obtaining the first speed at regular intervals, for example, every ten seconds.

In act 604, the first parameter of the first fan may be compared with a second parameter of a second fan. For example, the second parameter may be a second speed of the second fan, which may be known, or, if not, it may be requested from a controller or read from storage. Comparing the first speed with the second speed may involve, for example, determining which of the two speed values is higher or lower, calculating a difference between the two speed values, determining the absolute value of the difference, converting one or both of the two speed values into common units, and/or dividing the difference between the two speed values by one of the two speed values to calculate a percentage difference. In some cases the comparing may include multiple factors. For instance, the comparing may entail comparing a rotational speed, size, and/or pitch of the first fan to a rotational speed, size, and/or pitch of the second fan (e.g., airflow to airflow).

In act 606, the second parameter of the second fan may be adjusted based on the first parameter of the first fan. For example, the adjustment may involve setting a new speed for the second fan and/or setting a minimum speed for the second fan. The second speed of the second fan may be increased or decreased. The second speed (whether a new speed or a minimum speed) of the second fan may be set to equal the first speed, be greater than the first speed, or be less than the first speed. The adjustment can ensure that intended directional flow is achieved within a device and/or between devices.

The methods described above (including the reverse airflow prevention method 500 and the reverse flow prevention method 600) and the acts thereof can be performed by any system, device, and/or component described above, and/or by any other system, device, and/or components capable of performing the described methods or acts. The methods can be implemented in any suitable hardware, software, firmware, or combination thereof. For example, the methods may be stored on one or more computer-readable storage media as a set of instructions (e.g., computer-readable instructions or computer-executable instructions), such that execution by a processor of a computing device causes the computing device to perform the methods or acts. The order in which the methods and acts are described is not intended to be construed as a limitation, and any of the described methods and/or acts can be repeated, omitted, and/or combined in any order to implement the methods and/or act, or alternate methods and/or acts.

Various examples are described above. Although the subject matter has been described in language specific to structural features and/or methodological acts, the subject matter defined in the appended claims is not necessarily limited to the specific features or acts described above. Rather, the specific features and acts described above are presented as example forms of implementing the claims, and other features and acts that would be recognized by one skilled in the art are intended to be within the scope of the claims.

Additional examples are described below. One example includes a system comprising a system chassis having a system outlet, a system fan for moving warm air out of the system chassis through the system outlet, a power supply unit (PSU) having a PSU outlet and a PSU fan for moving warm air out of the PSU through the PSU outlet, a processor, and a storage storing instructions which, when executed by the processor, cause the processor to compare a system fan speed of the system fan and a PSU fan speed of the PSU fan and adjust the PSU fan speed upon determining that the PSU fan speed is different from the system fan speed to prevent warm air moving into the PSU through the PSU outlet.

Another example can include any of the above and/or below examples where the instructions further cause the processor to periodically monitor the system fan speed and/or the PSU fan speed.

Another example can include any of the above and/or below examples where the instructions further cause the processor to set a minimum speed for the PSU fan that equals the system fan speed.

Another example can include any of the above and/or below examples where the PSU fan speed is adjusted using a machine-learning model.

Another example includes a method comprising monitoring a first parameter of a first fan, comparing the first parameter of the first fan with a second parameter of a second fan, and adjusting the second parameter of the second fan based at least on the first parameter of the first fan to prevent a reverse airflow at the second fan.

Another example can include any of the above and/or below examples where the first fan moves air out of a first zone through a first outlet, the second fan moves air out of a second zone through a second outlet, and the adjusting prevents air moving into the second zone through the second outlet.

Another example can include any of the above and/or below examples where the monitoring includes periodically obtaining the first parameter of the first fan.

Another example can include any of the above and/or below examples where the first parameter of the first fan includes a first speed of the first fan, and the second parameter of the second fan includes a second speed of the second fan.

Another example can include any of the above and/or below examples where the adjusting includes increasing the second speed of the second fan if the first speed of the first fan is greater than the second speed of the second fan.

Another example can include any of the above and/or below examples where the adjusting includes increasing the second speed of the second fan if the first speed of the first fan is greater than the second speed of the second fan by a threshold.

Another example can include any of the above and/or below examples where the threshold is a percentage of the first speed of the first fan.

Another example can include any of the above and/or below examples where wherein the adjusting includes setting the second speed of the second fan to be equal to the first speed of the first fan.

Another example can include any of the above and/or below examples where the adjusting includes setting the second speed of the second fan to be greater than the first speed of the first fan, or wherein the adjusting considers relative sizes of the first fan and the second fan.

Another example can include any of the above and/or below examples where the adjusting includes setting a minimum speed for the second fan.

Another example can include any of the above and/or below examples where the comparing and the adjusting are performed iteratively with a learning model.

Another example includes a computer-readable storage medium storing instructions which, when executed by a processor, cause the processor to determine whether a fan speed adjustment condition has been met by monitoring a first speed of a first fan in a first zone and a second speed of a second fan in a second zone, and upon determining that the fan speed adjustment condition has been met, adjusting one or both of the first speed or the second speed to prevent a reverse flow of a heat-transferring medium into the first zone and the second zone.

Another example can include any of the above and/or below examples where the instructions further cause the processor to periodically obtain the first speed of the first fan and/or the second speed of the second fan.

Another example can include any of the above and/or below examples where the instructions further cause the processor to adjust one or both of the first speed or the second speed to be equal to each other.

Another example can include any of the above and/or below examples where the instructions further cause the processor to adjust one or both of the first speed or the second speed to be different from each other by a tolerance.

Another example can include any of the above and/or below examples where the instructions further cause the processor to set a minimum speed for one or both of the first fan or the second fan.

The invention claimed is:

1. A system, comprising:
    a system chassis having a system outlet;
    a system fan for moving warm air out of the system chassis through the system outlet;
    a power supply unit (PSU) having a PSU outlet and a PSU fan for moving warm air out of the PSU through the PSU outlet;
    a PSU fan controller for controlling the PSU fan; and
    a system fan controller for controlling the system fan, comparing a system fan speed of the system fan and a PSU fan speed of the PSU fan, and communicating with the PSU fan controller to adjust the PSU fan speed upon determining that the PSU fan speed is different from the system fan speed to prevent warm air moving into the PSU through the PSU outlet,
    the system fan controller being configured to communicate to the PSU fan controller a minimum speed for the PSU fan that equals the system fan speed; and
    the PSU fan controller being capable of overriding the minimum speed and setting an actual speed of the PSU fan that is greater than the minimum speed.

2. The system of claim 1, wherein the system fan controller is configured to periodically monitor the system fan speed and/or the PSU fan speed.

3. The system of claim 1, further comprising:
    a machine-learning model for adjusting the PSU fan speed, the machine-learning model being trained using a training data set, the machine-learning model being configured to receive at least one of the system fan speed or the PSU fan speed as input, and to output at least one of a new system fan speed or a new PSU fan speed.

4. A method, comprising:
    monitoring a first rotational speed of a first fan and a second rotational speed of a second fan;
    determining whether an adjustment condition has been met based at least on comparing the first rotational speed to the second rotational speed and at least one of the following: comparing a first fan size of the first fan to a second fan size of the second fan, comparing a first blade pitch of the first fan to a second blade pitch of the second fan, comparing a first number of blades of the first fan to a second number of blades of the second fan, comparing a first number of fans of the first fan to a second number of fans of the second fan, comparing a first position of the first fan to a second position of the second fan, comparing a first orientation of the first fan to a second orientation of the second fan, or comparing a first model of the first fan to a second model of the second fan; and adjusting the second rotational speed of the second fan based at least on the determination to prevent a reverse airflow at the second fan.

5. The method of claim 4, wherein:

the first fan moves air out of a first zone through a first outlet, the first fan being located near the first outlet;

the second fan moves air out of a second zone through a second outlet, the second fan being located near the second outlet; and the adjusting prevents air moving into the second zone through the second outlet.

6. The method of claim 4, wherein the monitoring includes periodically obtaining the first rotational speed of the first fan.

7. The method of claim 4, wherein the adjusting includes increasing the second rotational speed of the second fan if the first rotational speed of the first fan is greater than the second rotational speed of the second fan.

8. The method of claim 4, wherein the adjusting includes increasing the second rotational speed of the second fan if the first rotational speed of the first fan is greater than the second rotational speed of the second fan by a threshold.

9. The method of claim 8, wherein the threshold is a percentage of the first rotational speed of the first fan.

10. The method of claim 4, wherein the adjusting includes setting the second rotational speed of the second fan to be equal to the first rotational speed of the first fan.

11. The method of claim 4, wherein the adjusting includes setting the second rotational speed of the second fan to be greater than the first rotational speed of the first fan.

12. The method of claim 4, wherein the adjusting includes setting a minimum rotational speed for the second fan, the second rotational speed of the second fan capable of being greater than the minimum rotational speed for the second fan.

13. The method of claim 4, wherein the determining and the adjusting are performed iteratively with a learning model trained using a training data set, taking at least one of the first rotational speed of the first fan or the second rotational speed of the second fan as input, and outputting at least one of a new first rotational speed of the first fan or a new second rotational speed of the second fan.

14. The method of claim 12, wherein the minimum rotational speed is faster or slower than the first rotational speed by a tolerance.

15. A computer-readable storage medium storing instructions which, when executed by a first zone processor, cause the first zone processor to:

monitor a first speed of a first fan in a first zone;

communicate with a second zone processor to monitor a second speed of a second fan in a second zone;

determine whether a fan speed adjustment condition has been met based on the first speed and the second speed; and upon determining that the fan speed adjustment condition has been met, setting a minimum speed for one or both of the first fan or the second fan to prevent a reverse flow of a heat-transferring medium into the first zone and the second zone, an actual speed capable of being greater than the minimum speed.

16. The computer-readable storage medium of claim 15, wherein the instructions further cause the first zone processor to:

periodically obtain the first speed of the first fan and/or the second speed of the second fan.

17. The computer-readable storage medium of claim 15, wherein the instructions further cause the first zone processor to:

adjust one or both of the first speed or the second speed to be equal to each other.

18. The computer-readable storage medium of claim 15, wherein the instructions further cause the first zone processor to:

adjust one or both of the first speed or the second speed to be different from each other by a tolerance.

19. The computer-readable storage medium of claim 15, wherein:

the first zone is a first server and the second zone is a second server; or the first zone is a first cabinet and the second zone is a second cabinet.

20. The computer-readable storage medium of claim 15, wherein the fan speed adjustment condition is met upon determining that a difference between the first speed and the second speed exceeds a threshold.

* * * * *